United States Patent
Willkofer et al.

(10) Patent No.: US 9,891,640 B2
(45) Date of Patent: Feb. 13, 2018

(54) SENSING ELEMENT FOR SEMICONDUCTOR

(71) Applicant: Infineon Technologies AG, Neubiberg (DE)

(72) Inventors: Stefan Willkofer, Munich (DE); Andreas Kiep, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/918,842

(22) Filed: Jun. 14, 2013

(65) Prior Publication Data

US 2014/0368258 A1  Dec. 18, 2014

(51) Int. Cl.

| H01L 27/02 | (2006.01) |
|---|---|
| G05F 1/46 | (2006.01) |
| H01L 23/34 | (2006.01) |
| H01L 29/739 | (2006.01) |
| H01L 27/06 | (2006.01) |
| H02M 1/32 | (2007.01) |

(52) U.S. Cl.
CPC .............. *G05F 1/463* (2013.01); *H01L 23/34* (2013.01); *H01L 27/02* (2013.01); *H01L 29/7397* (2013.01); *H01L 27/0629* (2013.01); *H01L 2924/0002* (2013.01); *H02M 2001/327* (2013.01)

(58) Field of Classification Search
None
See application file for complete search history.

(56) References Cited

U.S. PATENT DOCUMENTS

| 4,924,112 | A | * | 5/1990 | Anderson et al. | ............... 326/32 |
| 5,049,961 | A | * | 9/1991 | Zommer et al. | ............... 257/470 |
| 5,099,138 | A | * | 3/1992 | Fukunaga | ..................... 327/109 |
| 5,905,645 | A | * | 5/1999 | Cross | ............................... 363/65 |
| 6,323,518 | B1 | | 11/2001 | Sakamoto et al. | |
| 6,504,208 | B2 | * | 1/2003 | Bosco et al. | .................. 257/341 |
| 6,717,788 | B2 | * | 4/2004 | Sommer | ............. H01L 27/0248 361/103 |
| 6,747,884 | B2 | * | 6/2004 | Nishizawa | ............ H02M 5/458 363/132 |
| 6,906,399 | B2 | * | 6/2005 | Fruth et al. | .................... 257/577 |
| 7,265,566 | B2 | * | 9/2007 | Graf | ........................... 324/750.3 |
| 7,462,922 | B2 | * | 12/2008 | Mori et al. | ..................... 257/470 |
| 7,622,887 | B2 | * | 11/2009 | Yoshimura | ..................... 318/810 |
| 7,835,129 | B2 | * | 11/2010 | Thiele | ........................... 361/103 |
| 8,138,600 | B2 | * | 3/2012 | Muto | .................... H01L 21/565 257/724 |
| 8,423,317 | B2 | * | 4/2013 | Kamezawa | ............. G01K 7/22 323/282 |
| 8,508,258 | B2 | * | 8/2013 | Ishikawa et al. | ............. 327/108 |

(Continued)

FOREIGN PATENT DOCUMENTS

| CN | 103186278 A | 7/2013 |
| CN | 103258226 A | 8/2013 |
| DE | 102007008389 A1 | 10/2007 |

*Primary Examiner* — Thomas J Hiltunen
(74) *Attorney, Agent, or Firm* — Slater Matsil, LLP

(57) ABSTRACT

An embodiment relates to a device comprising a high-side semiconductor, a low-side semiconductor, a first sensing element arranged adjacent to the high-side semiconductor. The first sensing element is isolated from the high-side semiconductor and the first sensing element is directly connectable to a processing device.

25 Claims, 2 Drawing Sheets

(56) References Cited

U.S. PATENT DOCUMENTS

| | | | |
|---|---|---|---|
| 8,582,335 B2* | 11/2013 | Hasegawa | B60L 3/003 |
| | | | 363/132 |
| 8,979,362 B2 | 3/2015 | Weder et al. | |
| 9,256,306 B2 | 2/2016 | Chan et al. | |
| 2003/0072117 A1* | 4/2003 | Maekawa | H02M 1/08 |
| | | | 361/86 |
| 2005/0099751 A1* | 5/2005 | Kumagai | H03K 17/0828 |
| | | | 361/100 |
| 2005/0127755 A1* | 6/2005 | Aichriedler | B60R 21/017 |
| | | | 307/10.1 |
| 2006/0192599 A1* | 8/2006 | Haerle et al. | 327/108 |
| 2008/0111506 A1* | 5/2008 | Muta | B60K 6/365 |
| | | | 318/15 |
| 2009/0046489 A1* | 2/2009 | Yoshimura | H01F 17/0013 |
| | | | 363/123 |
| 2012/0074884 A1* | 3/2012 | Okada | B60L 3/003 |
| | | | 318/400.21 |
| 2012/0219033 A1* | 8/2012 | Tanimura et al. | 374/1 |
| 2015/0108929 A1* | 4/2015 | Nobe | H02P 6/085 |
| | | | 318/400.3 |

\* cited by examiner

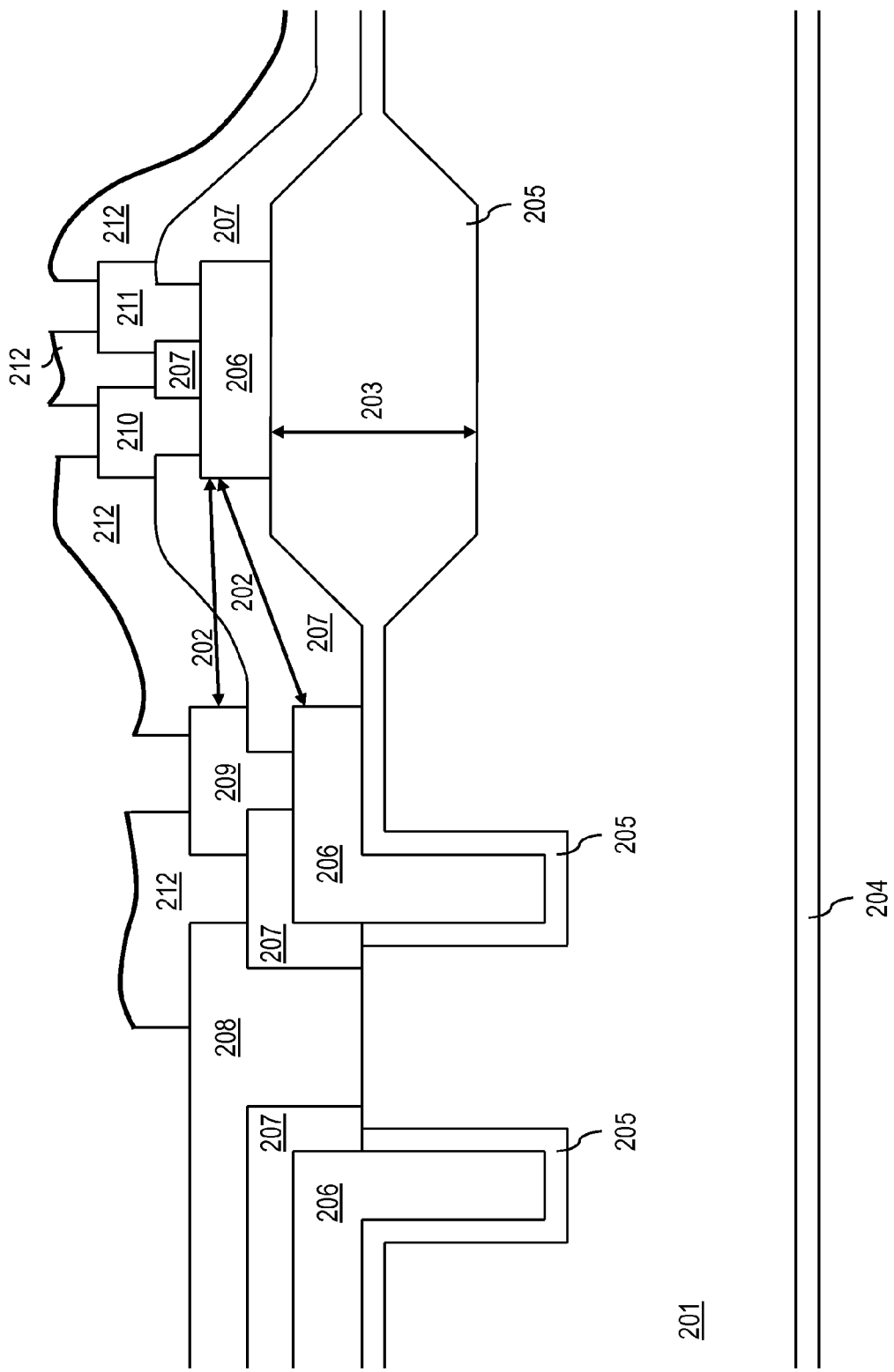

SENSING ELEMENT FOR SEMICONDUCTOR

BACKGROUND

If a sensor is embedded in a semiconductor, the sensor experiences the same voltage as the semiconductor. For example, a temperature sensor embedded in a low-side IGBT (with a voltage over ground) can be monitored by a ground-referenced circuit. However, monitoring a temperature sensor embedded in a high-side IGBT requires a circuit with a reference potential at the emitter voltage of this high-side IGBT.

To forward the high-side analog temperature signal to a central circuit which has a reference to ground, e.g., a microcontroller or a digital signaling processor (DSP), the temperature signal is processed in a galvanically isolated manner, e.g., digitized and processed by an optocoupler or a pulse transformer. This is a costly measure which requires additional components and space. This effect becomes even more apparent in case multiple half bridges, i.e. a lot of high-side and low-side semiconductors are used, each (also the high-side switches) having a temperature sensor that should be subject to monitoring.

As an option, an analog-to-digital converter may be incorporated in a driver, e.g., a driver integrated circuit, e.g., a coreless transformer. In such scenario, an analog temperature signal can be digitized by the driver, processed (e.g., by some sort of protocol) and transmitted via the coreless transformer to the processing device (which may operate with ground as reference potential). The processing device than extracts the received temperature information for further processing purposes.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 2 shows a schematic sectional view of a transistor with an embedded temperature sensor.

DETAILED DESCRIPTION OF THE PREFERRED EMBODIMENTS

Figure 1:
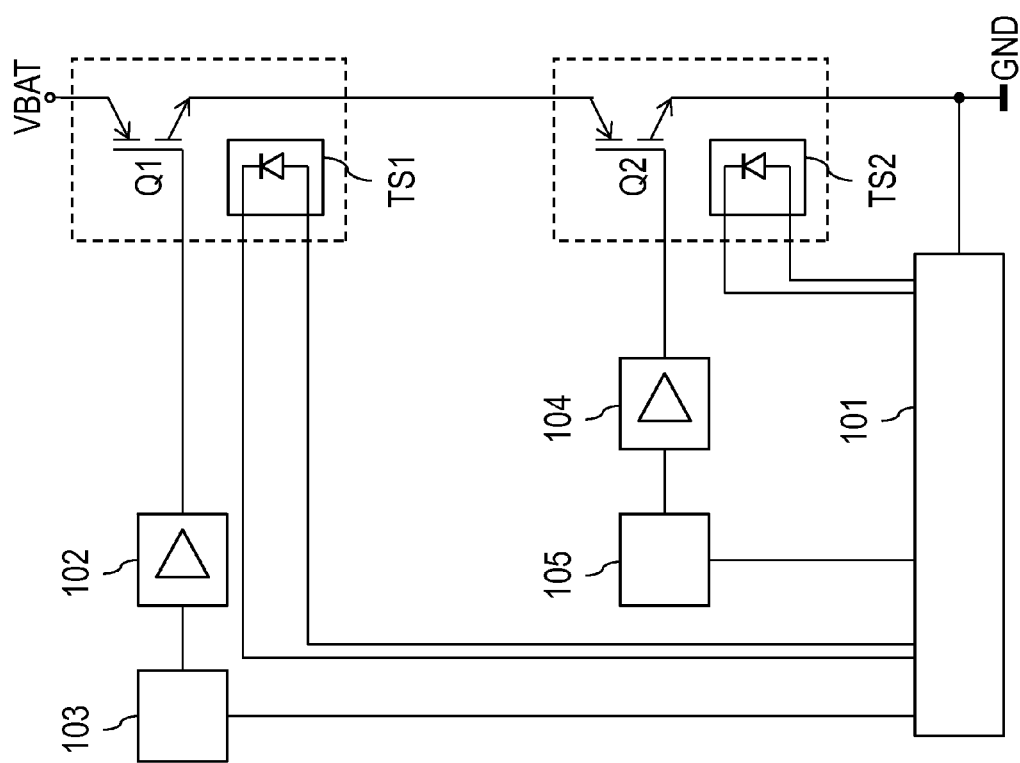
FIG. 1 shows a schematic diagram of a half bridge arrangement comprising two transistors with each transistor having a temperature sensor, which is directly connected to a processing device.

Embodiments relate to sensing of information in semiconductors that are operated at different and differing voltages.

A first embodiment relates to a device comprising a high-side semiconductor, a low-side semiconductor, a first sensing element arranged adjacent to the high-side semiconductor. The first sensing element is isolated from the high-side semiconductor and the first sensing element is directly connectable to a processing device. Directly connectable in this regard refers in particular to a connection without a galvanic isolation. Directly connectable may comprise a connection via a filter, e.g., a capacitor and/or resistor.

The high-side semiconductor and/or the low-side semiconductor may comprise a switch and/or a diode. A half-bridge arrangement could be implemented using the high-side and the low-side semiconductor. A switch and a parallel diode (or several such diodes connected in parallel may be used as an element of the half-bridge arrangement. In such an exemplary scenario, the half-bridge arrangement comprises four semiconductor elements, i.e. two switches and two diodes.

A second embodiment relates to a circuit comprising a high-side semiconductor, a low-side semiconductor, a first sensing element embedded in or with the high-side semiconductor, wherein the first sensing element is (electrically) isolated from the high-side semiconductor. The circuit further comprises a processing device, wherein the first sensing element is directly connected to the processing device.

A third embodiment relates to a method for controlling a high-side semiconductor and a low-side semiconductor, which are connected in series in a half bridge arrangement, with a first sensing element embedded in or with the high-side semiconductor, wherein the first sensing element is (electrically) isolated from the high-side semiconductor, with a second sensing element embedded in or with the low-side semiconductor, wherein the second sensing element is isolated from the low-side semiconductor, and with at least one processing device that is arranged to control the high-side semiconductor and the low-side semiconductor and is directly connected to the first sensing element and to the second sensing element. The at least one processing device is arranged for determining a first information based on a signal provided by the first sensing element; for determining a second information based on a signal provided by the second sensing element; and for controlling the high-side semiconductor and the low-side semiconductor based on the first information and on the second information.

A forth embodiment is directed to a system for controlling a high-side semiconductor and a low-side semiconductor, which are connected in series in a half bridge arrangement. The system comprises a first sensing element embedded in or with the high-side semiconductor, wherein the first sensing element is (electrically) isolated from the high-side semiconductor, a second sensing element embedded in or with the low-side semiconductor, wherein the second sensing element is (electrically) isolated from the low-side semiconductor; and a processing device that is arranged to control the high-side semiconductor and the low-side semiconductor and is directly connected to the first sensing element and to the second sensing element. The system further comprises means for determining a first information based on a signal provided by the first sensing element; means for determining a second information based on a signal provided by the second sensing element; and means for controlling the high-side semiconductor and the low-side semiconductor based on the first information and on the second information.

In many half bridge circuits like DC/DC converters or inverters used for, e.g., motor controls, there is at least one high-side semiconductor and one low-side semiconductor, e.g. an IGBT, a MOSFET, a BJT, a JFET, or a diode. The high-side semiconductor may be connected to a high voltage over ground and the low-side semiconductor may be connected to ground or at least closer to ground than the high-side semiconductor. In particular, the high-side semiconductor is arranged at a higher voltage compared to a reference potential compared to the low-side semiconductor.

"Ground" refers to ground potential or any reference potential that is deemed appropriate or is selected as reference potential.

It is suggested to arrange a first sensing element in the vicinity, in particular adjacent to the high-side semiconductor. Accordingly, a second sensing element can be arranged in the vicinity, in particular adjacent to the low-side semiconductor. The first sensing element can be embedded in the high-side semiconductor or it can be embedded together with the high-side semiconductor. Accordingly, the second sensing element can be embedded in the low-side semiconductor or it can be embedded together with the low-side semiconductor. The first sensing element and the second sensing element can each be realized as a sensor for detecting information, e.g., pressure, current, voltage, light, humidity, etc. and to convey the information to a processing device.

Pursuant to the example described herein, the first sensing element and the second sensing element do not require any additional galvanic isolation from the processing device. They can be directly connected to the processing device, even if the high-side semiconductor is operated at a floating high-volt potential and the low-side semiconductor is operated over ground.

Hence, the first sensing element and the second sensing element are isolated from the high-side semiconductor and from the low-side semiconductor via at least one isolation layer.

In case the sensor (first and/or second sensing element) is embedded in the semiconductor, an information of the semiconductor can be sensed, i.e., monitored by the processing device in a continuous or iterative manner.

The examples discussed herein are in particular useful for applications using an operating voltage or supply voltage in the range from 40 Volts up to more than 700 Volts.

The solution presented in particular allows sensing an information, e.g., a temperature, at various locations of a semiconductor component arranged at a high-side or at a low-side. The semiconductor component may be an electronic switch or any other semiconductor component that may be subject to monitoring, e.g., an IGBT, a MOSFET, a BJT, a JFET, or a diode. The temperature sensor may be a semiconductor element, e.g., a diode or a series connection comprising several diodes. The sensor may also comprise at least one of the following for sensing various kinds of information: a hall sensor, a pressure sensor, a current sensor.

In the following, an electronic switch, e.g., a transistor, is exemplarily chosen as a semiconductor component that is subject to monitoring. The information monitored is exemplarily a temperature in the electronic switch or in the vicinity of the electronic switch. The temperature sensing element may be a diode that may be embedded in or together with the electronic switch. The electronic switch may be deployed as part of a half bridge or a full bridge arrangement as used in, e.g., a DC-DC converter, a power supply, a motor controller, or the like.

Accordingly, other semiconductor components and/or electronic switches in different arrangement could be subject to any sort of monitoring according to the examples suggested herein.

Two electronic switches, e.g. transistors, in particular IGBTs, may be arranged in a series connection to one another between a supply voltage and ground. The electronic switch that is connected to or closer to the supply voltage is also referred to as high-side switch and the electronic switch that is connected to or closer to ground is referred to as low-side switch.

Advantageously, the information, e.g., temperature, sensed can be determined at the high-side switch as well as at the low-side switch via a single processing device without further galvanic isolation circuitry like transformers or optocouplers. This allows for an improved monitoring and supervision and in particular to detect any irregularity or malfunction at an early stage or even before it actually occurs. It is in particular an option to monitor all electronic switches and determine a change of temperature by evaluating the sensed signal by, e.g., a microcontroller or a signal processor.

For example, the temperature can be transferred from each electronic switch to the processing device, preferably with little or no delay (in real-time).

According to an example, the sensor (e.g., a temperature sensor realized as, e.g., a diode) may be arranged such that it has a high-voltage blocking capability. The sensor may be realized as an integrated sensor embedded in the semiconductor component. The sensor may be galvanically isolated from the semiconductor component. Isolation may be achieved by an isolating layer.

In case the semiconductor component is an electronic switch comprising gate, source and drain or base, collector and emitter, the sensor may be realized such that it has a high-voltage blocking capability and that it may be isolated from the drain/collector, source/emitter and gate up to a predetermined drain-source voltage or up to a predetermined collector-emitter voltage.

Hence, each sensor may be supplied such that it has sufficient voltage isolation over ground, whether the sensor is integrated in or near the high-side switch or the low-side switch. The high-side switch and the low-side switch are hereby examples for semiconductor components; other semiconductor components that are subject to information monitoring may be used accordingly.

Each sensor may be read by a processing device, which optionally also processes the information obtained. The processing device may be a microcontroller or a signal processor with ground as reference potential. However, the processing device may have a different (fixed) reference potential as well.

Pursuant to an example, various temperatures sensed by several temperature sensors adjacent to several electronic switches of a half bridge arrangement can be monitored by a single processing device with, e.g., ground as reference potential. The processing device can thus act as a monitoring unit that determines whether the temperature stays within a predetermined range of temperature or that it falls below or exceeds said range. Hence, a comparison with a predefined value can be provided, wherein the predefined value may be a fixed value or a gradient (e.g., variation over time). Hence, temperature variations may also be considered in order to detect impending malfunctions or defects.

The temperature sensors may be embedded in or adjacent to various semiconductor components, e.g., transistors of all kinds, IGBTs, MOSFETs, BJTs or diodes, no matter whether they are located on the high-side or on the low-side of a circuitry.

Hence, an analog-to-digital conversion or a galvanic isolation of the sensed information may not be required, which reduces costs and efforts as well as board space.

The example discussed utilizes adding sufficient voltage isolation to the (e.g., embedded) temperature sensor itself (to ground, and/or to any of the connections of a semiconductor component that is monitored), e.g., via an isolation layer.

FIG. 1 shows a schematic diagram of a half bridge arrangement comprising a transistor Q1 and a transistor Q2. The transistors Q1, Q2 may be IGBTs, BJTs, MOSFETs or JFETs. One of the transistors Q1, Q2 may be replaced by a diode. In the example according to FIG. 1, the transistors Q1 and Q2 may in particular be realized as IGBTs, wherein the transistor Q1 has an integrated temperature sensor TS1 and the transistor Q2 has an integrated temperature sensor TS2. The temperature sensors TS1 and TS2 may be realized as diodes, respectively.

The transistor Q1 is controlled via a driver 102, which is connected via an isolation unit 103 to a processing device 101 (e.g., a processor, a microcontroller or a signal processor). Accordingly the transistor Q2 is controlled via a driver 104, which is connected to the processing device 101 via an isolation unit 105.

The isolation unit 103, 105 can be realized as an optocoupler, a transformer or any galvanically isolating element. The isolation unit 103, 105 enables controlling the respective transistor Q1, Q2 by the processing device 101, wherein the processing device 101 in this example of FIG. 1 has ground as a reference potential and the gates of the transistors Q1, Q2 may have different (floating) reference potentials (other than ground).

Hence, the processing device 101 controls the transistors Q1, Q2 of the half bridge via the isolation units 103, 105 and the drivers 102, 104.

The temperature sensor TS1 is connected to the processing device 101. Also, the temperature sensor TS2 is connected to the processing device. Due to a high-voltage isolation of the temperature sensor TS1 from the transistor Q1, the signal sensed can be directly fed (connected) to the processing device 101. This applies for the temperature sensor TS2 with respect to the transistor Q2 accordingly. In this example, no additional high-voltage decoupling device, e.g., transformer, optocoupler, analog-to-digital conversion or the like is/are required for detecting the information sensed by the temperature sensors TS1 and TS2.

Each of the temperature sensors TS1, TS2 can be isolated via a thick field oxide, e.g., in the range between 1.5 µm and 2 µm, as insulation layer against a vertical breakdown. Each of the temperature sensors TS1, TS2 is in particular isolated with regard to the emitter potential of its respective transistor Q1, Q2.

It is an option to use the body diode of (e.g., low voltage) MOSFETs as a temperature sensor.

The integrated temperature sensor may advantageously have high-voltage blocking capability. It may beneficially be isolated from the drain/collector, the source/emitter and the gate up to a predefined drain-source voltage or collector-emitter voltage. Hence, the temperature sensor may have sufficient voltage isolation with respect to ground, regardless of whether the sensor is integrated in the high-side switch or the low-side switch. Hence, each single temperature sensor can be read and processed by a single ground-referenced circuit, e.g., the processing device mentioned herein.

Galvanic isolation of the temperature sensor (comprising at least one sensing element) can be achieved by at least one of the following:
- the sensing element is made from pin-diodes integrated monolithically into the integrated circuit;
- the sensing element is placed close to the middle of the chip or wherever most heat dissipation may occur;
- the sensing element is placed on top of a thick insulating, in particular a non-interrupted (end-to-end) layer;
- connections from sensing element to contact pads may have a predefined (e.g., minimal) distance to elements on the chip that carry a voltage level compared to the sensing element.

The thick isolation layer can be a thermally oxidized silicon dioxide. Also, similar oxide layers (PE-CVD) or other insulating layers (nitride) and combinations thereof can be used. The thickness of the layer may be chosen to meet a predefined voltage robustness.

Hence, the voltage breakdown robustness of the temperature sensor compared to emitter potential (and collector and gate) can be improved. This may be achieved via the thick oxide layer as insulating layer against emitter potential; the sensing elements can be placed upon this oxide layer.

It is noted that the example also works with a processing device 101 having any reference potential other than ground.

FIG. 2 shows an exemplary structure of a transistor Q1 (IGBT) and the temperature sensor TS1, which is exemplarily embedded together with the transistor Q1.

The IGBT comprises an npn junction, the gate of the IGBT can be made of a trench with a gate oxide. Applying a voltage greater than a predefined threshold voltage opens a channel for electrons in the p space. The IGBT is then turned-on. The temperature sensor TS1 comprises a poly silicon layer with an implanted pn-junction. Metall contacts into the poly silicon form the anode and the cathode.

A metallic layer 204 is attached to one side of a silicon waver 201. This metallic layer 204 corresponds to a collector-contact of the transistor Q1.

On the other side of the silicon waver 201, an emitter-contact 208 (as a metallic layer or structure) and a gate-contact 209 (as a metallic layer or structure) of the transistor Q1 are provided. The emitter-contact 208 is arranged above a conducting layer 206 (e.g., of polycrystalline silicon) and an intermediate oxide layer 207, but is in direct contact with the silicon waver 201. The gate-contact 209 is also above the conducting layer 206 and the oxide layer 207, but is in direct contact with the conducting layer 206.

Adjacent to the transistor Q1 is the temperature sensor TS1 realized as a diode comprising an anode-contact 210 and a cathode-contact 211 above the oxide layer 207 and the conducting layer 206.

Between the conducting layer 206 and the silicon waver 204 a gate oxide 205 is applied except for the direct contact with the emitter 208 of the transistor Q1. The gate oxide 205 is rather thin (e.g., in the range between 50 nm to 100 nm), but has an increased thickness 203 (also referred to as vertical isolation, e.g., in the range between 1.5 µm and 2 µm) below the conducting layer 206 that is in touch with the anode-contact 210 and the cathode-contact 211. The underlying bulk silicon 201 in this embodiment has, e.g., emitter potential.

In addition, an arrow 202 visualizes a distance between the gate-contact 209 (either the metallic layer or the conducting layer 206 below the gate contact 209) and the conducting layer 206 below the anode-contact 210 of the diode. The distance (also referred to as lateral isolation) indicated by the arrows 202 is preferably larger than 15 µm.

Further, a passivation layer 212 is at least partially applied on top of the arrangement, in particular between and partially covering the electrical contacts.

At least one of the following examples and/or embodiments may be considered innovative. They might be combined with other aspects or embodiments as described. Any embodiment or design described herein is not necessarily to be construed as preferred or advantageous over other embodiments or designs.

A device is suggested comprising
a high-side semiconductor,
a low-side semiconductor,
a first sensing element arranged adjacent to the high-side semiconductor, wherein the first sensing element is isolated from the high-side semiconductor;

wherein the first sensing element is directly connectable to a processing device.

In an embodiment, the device
comprises a second sensing element arranged adjacent to the low-side semiconductor,
wherein the second sensing element is isolated from the low-side semiconductor and
wherein the second sensing element is directly connectable to the processing device.

In an embodiment, the first sensing element is embedded in or with the high-side semiconductor and the second sensing element is embedded in or with the low-side semiconductor.

In an embodiment, the first sensing element and the second sensing element are isolated from the high-side semiconductor and from the low-side semiconductor via at least one lateral isolation and via at least one vertical isolation.

In an embodiment, the lateral isolation comprises an isolation of at least 15 µm.

In an embodiment, the vertical isolation comprises an isolation in the range of 1.5 µm to 2 µm.

In an embodiment, said isolation comprises an insulating layer.

In an embodiment, the insulating layer comprises at least one of the following:
  an oxide layer;
  a thermally oxidized silicon dioxide;
  a nitride layer.

In an embodiment, the device comprises a processing device, wherein the first sensing element and the second sensing element are each directly connected to the processing device.

In an embodiment, the high-side semiconductor and/or the low-side semiconductor comprises at least one of the following:
  an electronic switch;
  a bipolar transistor;
  a bipolar junction transistor;
  a diode;
  a junction field-effect transistor;
  an IGBT;
  a MOSFET.

In an embodiment, the processing device is at least one of the following:
  a processor;
  a controller;
  a microcontroller;
  a signal processing unit.

In an embodiment, the processing device is connected to a reference potential.

In an embodiment, the reference potential is ground.

In an embodiment, at least one pin of the high-side semiconductor is at least temporarily at a voltage in a range between 30 Volt and 1000V with regard to ground.

In an embodiment, the first sensing element and/or the second sensing element comprises at least one of the following:
  a temperature sensor;
  an integrated temperature-dependent sensor;
  a hall sensor;
  a pressure sensor;
  a current sensor.

In an embodiment, the first sensing element and/or the second sensing element comprises at least one diode as a temperature sensor.

In an embodiment, the first sensing element and/or the second sensing element comprises a body diode of a transistor.

In an embodiment, the high-side semiconductor and the low-side semiconductor are arranged in a half-bridge configuration or are part of a full-bridge configuration.

A circuit is provided comprising
  a high-side semiconductor,
  a low-side semiconductor,
  a first sensing element embedded in or with the high-side semiconductor, wherein the first sensing element is isolated from the high-side semiconductor;
  a processing device, wherein the first sensing element is directly connected to the processing device.

In an embodiment, the circuit
comprises a second sensing element embedded in or with the low-side semiconductor,
wherein the second sensing element is isolated from the low-side semiconductor and
wherein the second sensing element is directly connected to the processing device.

In an embodiment,
the high-side semiconductor and the low side semiconductor are electronic switches or wherein at least one of the high-side semiconductor and the low side semiconductor comprises a diode,
which are connected in series,
which are controlled via the processing device.

In an embodiment, the circuit may be used in or part of a half bridge or full bridge arrangement.

A method is suggested for controlling a high-side semiconductor and a low-side semiconductor,
  which are connected in series in a half bridge arrangement,
  with a first sensing element embedded in or with the high-side semiconductor, wherein the first sensing element is isolated from the high-side semiconductor,
  with a second sensing element embedded in or with the low-side semiconductor, wherein the second sensing element is isolated from the low-side semiconductor,
  with at least one processing device that is arranged to control the high-side semiconductor and the low-side semiconductor and is directly connected to the first sensing element and to the second sensing element,
wherein said at least one processing device is arranged
  for determining a first information based on a signal provided by the first sensing element;
  for determining a second information based on a signal provided by the second sensing element;
  for controlling the high-side semiconductor and the low-side semiconductor based on the first information and on the second information.

In an embodiment, said processing device is arranged for determining a malfunction based on the first information and/or the second information and for executing a predefined action based the malfunction determined.

A system is provided for controlling a high-side semiconductor and a low-side semiconductor,
  which are connected in series in a half bridge arrangement;
  with a first sensing element embedded in or with the high-side semiconductor, wherein the first sensing element is isolated from the high-side semiconductor;
  with a second sensing element embedded in or with the low-side semiconductor, wherein the second sensing element is isolated from the low-side semiconductor;

with a processing device that is arranged to control the high-side semiconductor and the low-side semiconductor and is directly connected to the first sensing element and to the second sensing element, comprising means for determining a first information based on a signal provided by the first sensing element;

means for determining a second information based on a signal provided by the second sensing element;

means for controlling the high-side semiconductor and the low-side semiconductor based on the first information and on the second information.

Although various exemplary embodiments have been disclosed, it will be apparent to those skilled in the art that various changes and modifications can be made which will achieve some of the advantages of the embodiments without departing from the spirit and scope of the invention, as set forth in the claims. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the embodiments may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A device comprising
a high-side semiconductor,
a low-side semiconductor,
a first sensing element arranged adjacent to the high-side semiconductor, wherein the first sensing element is isolated from the high-side semiconductor, wherein the first sensing element is directly connectable to a single processing device, and
a second sensing element arranged adjacent to the low-side semiconductor, wherein the second sensing element is isolated from the low-side semiconductor and the second sensing element is directly connectable to the single processing device, wherein the first sensing element is embedded in or with the high-side semiconductor and the second sensing element is embedded in or with the low-side semiconductor, portions of the first sensing element and the second sensing element are isolated from the high-side semiconductor and from the low-side semiconductor via at least one lateral isolation and via at least one vertical isolation, the at least one vertical isolation comprises an insulating layer, portions of the insulating layer between the first sensing element and the high-side semiconductor are thicker than surrounding portions of the insulating layer on the high-side semiconductor, and portions of the insulating layer between the second sensing element and the low-side semiconductor are thicker than surrounding portions of the insulating layer on the low-side semiconductor.

2. The device according to claim 1, wherein the lateral isolation comprises an isolation of at least 15 μm.

3. The device according to claim 1, wherein the vertical isolation comprises an isolation in the range of 1.5 μm to 2 μm.

4. The device according to claim 1, wherein the insulating layer comprises at least one of the following:

an oxide layer;
a thermally oxidized silicon dioxide;
a nitride layer.

5. The device according to claim 1, comprising the single processing device, wherein the first sensing element and the second sensing element are each directly connected to the single processing device.

6. The device of claim 5, wherein the single processing device is a microcontroller.

7. The device according to claim 1, wherein the high-side semiconductor and/or the low-side semiconductor comprises at least one of the following:

an electronic switch;
a bipolar transistor;
a bipolar junction transistor;
a diode;
a junction field-effect transistor;
an IGBT;
a MOSFET.

8. The device according to claim 1, wherein the single processing device is at least one of the following:

a processor;
a controller;
a microcontroller;
a signal processing unit.

9. The device according to claim 1, wherein the single processing device is connected to a reference potential.

10. The device according to claim 9, wherein the reference potential is ground.

11. The device according to claim 9, wherein at least one pin of the high-side semiconductor is at least temporarily at a voltage in a range between 30 Volt and 1000V with regard to ground.

12. The device according to claim 1, wherein the first sensing element and/or the second sensing element comprises at least one of the following:

a temperature sensor;
an integrated temperature-dependent sensor;
a hall sensor;
a pressure sensor;
a current sensor.

13. The device according to claim 1, wherein the first sensing element and/or the second sensing element comprises at least one diode as a temperature sensor.

14. The device according to claim 1, wherein the first sensing element and/or the second sensing element comprises a body diode of a transistor.

15. The device according to claim 1, wherein the high-side semiconductor and the low-side semiconductor are arranged in a half-bridge configuration or are part of a full-bridge configuration.

16. The device of claim 1, wherein the portions of the insulating layer between the first sensing element and the high-side semiconductor extend below a top surface of a substrate of the high-side semiconductor, and portions of the insulating layer between the second sensing element and the low-side semiconductor extend below a top surface of a substrate of the low-side semiconductor.

17. A circuit comprising:
a high-side semiconductor,
a low-side semiconductor,
a first sensing element embedded in or with the high-side semiconductor, wherein the first sensing element is isolated from the high-side semiconductor;
a single processing device, wherein the first sensing element is directly connected to the single processing device; and a second sensing element embedded in or with the low-side semiconductor, wherein the second sensing element is isolated from the low-side semiconductor and the second sensing element is directly connected to the single processing device, wherein portions of the first sensing element and the second sensing element are isolated from the high-side semiconductor and from the low-side semiconductor via at least one lateral isolation and via at least one vertical isolation, the at least one vertical isolation comprises an insulating layer, portions of the insulating layer between the first sensing element and the high-side semiconductor are thicker than surrounding portions of the insulating layer on the high-side semiconductor, and portions of the insulating layer between the second sensing element and the low-side semiconductor are thicker than surrounding portions of the insulating layer on the low-side semiconductor.

18. The circuit according to claim 17,
wherein the high-side semiconductor and the low-side semiconductor are electronic switches or wherein at least one of the high-side semiconductor and the low-side semiconductor comprises a diode,
which are connected in series,
which are controlled via the single processing device.

19. The circuit according to claim 18 for use in a half bridge or full bridge arrangement.

20. The circuit of claim 17, wherein the single processing device is a microcontroller.

21. A method for controlling a high-side semiconductor and a low-side semiconductor,
which are connected in series in a half bridge arrangement,
with a first sensing element embedded in or with the high-side semiconductor, wherein the first sensing element is isolated from the high-side semiconductor,
with a second sensing element embedded in or with the low-side semiconductor, wherein the second sensing element is isolated from the low-side semiconductor,
with a single processing device that is arranged to control the high-side semiconductor and the low-side semiconductor and is directly connected to the first sensing element and to the second sensing element,
wherein said single processing device is arranged to perform the method, comprising:
determining a first information based on a signal provided by the first sensing element;
determining a second information based on a signal provided by the second sensing element; and
controlling the high-side semiconductor and the low-side semiconductor based on the first information and on the second information, wherein portions of the first sensing element and the second sensing element are isolated from the high-side semiconductor and from the low-side semiconductor via at least one lateral isolation and via at least one vertical isolation, the at least one vertical isolation comprises an insulating layer, portions of the insulating layer between the first sensing element and the high-side semiconductor are thicker than surrounding portions of the insulating layer on the high-side semiconductor, and portions of the insulating layer between the second sensing element and the low-side semiconductor are thicker than surrounding portions of the insulating layer on the low-side semiconductor.

22. The method according to claim 21, wherein said single processing device is arranged to perform the method further comprising determining a malfunction based on the first information and/or the second information and for executing a predefined action based the malfunction determined.

23. A system for controlling a high-side semiconductor and a low-side semiconductor,
which are connected in series in a half bridge arrangement;
with a first sensing element embedded in or with the high-side semiconductor, wherein the first sensing element is isolated from the high-side semiconductor;
with a second sensing element embedded in or with the low-side semiconductor,
wherein the second sensing element is isolated from the low-side semiconductor;
with a single processing device that is arranged to control the high-side semiconductor and the low-side semiconductor and is directly connected to the first sensing element and to the second sensing element,
comprising
means for determining a first information based on a signal provided by the first sensing element;
means for determining a second information based on a signal provided by the second sensing element; and
means for controlling the high-side semiconductor and the low-side semiconductor based on the first information and on the second information, wherein portions of the first sensing element and the second sensing element are isolated from the high-side semiconductor and from the low-side semiconductor via at least one lateral isolation and via at least one vertical isolation, the at least one vertical isolation comprises an insulating layer, portions of the insulating layer between the first sensing element and the high-side semiconductor are thicker than surrounding portions of the insulating layer on the high-side semiconductor, and portions of the insulating layer between the second sensing element and the low-side semiconductor are thicker than surrounding portions of the insulating layer on the low-side semiconductor.

24. The system of claim 23, wherein the single processing device is a microcontroller.

25. The method of claim 21, wherein the single processing device is a microcontroller.

* * * * *